United States Patent [19]

Fukuyama et al.

[11] Patent Number: 4,657,843
[45] Date of Patent: Apr. 14, 1987

[54] USE OF POLYSILSESQUIOXANE WITHOUT HYDROXYL GROUP FOR FORMING MASK

[75] Inventors: Shun-ichi Fukuyama, Atsugi; Yasuhiro Yoneda, Machida; Masashi Miyagawa; Kota Nishii, both of Isehara, all of Japan

[73] Assignee: Fujitsu Limited, Kanagawa, Japan

[21] Appl. No.: 835,741

[22] Filed: Mar. 3, 1986

Related U.S. Application Data

[62] Division of Ser. No. 739,158, May 30, 1985.

[30] Foreign Application Priority Data

May 30, 1984 [JP]  Japan .............................. 59-108521
May 31, 1984 [JP]  Japan .............................. 59-109503

[51] Int. Cl.$^4$ ........................... G03C 5/16; G03F 7/26
[52] U.S. Cl. .................................... 430/323; 430/325; 430/296; 430/270; 430/271; 430/312; 430/313; 430/327; 430/286; 156/643; 528/10
[58] Field of Search ............... 430/325, 296, 270, 312, 430/313, 323, 327, 271, 286; 156/643; 528/10

[56] References Cited

U.S. PATENT DOCUMENTS 4,600,685  7/1986  Kitakohji et al. ............... 430/325 X

FOREIGN PATENT DOCUMENTS 0168247 10/1982  Japan ................................... 430/270
0059347  4/1985  Japan ................................... 430/270

OTHER PUBLICATIONS

W. S. DeForest, *Photoresist: Materials and Processes*, McGraw-Hill Book Company, New York, N.Y., 1975, pp. 101-102, 146-147.

*Primary Examiner*—John E. Kittle
*Assistant Examiner*—Cynthia Hamilton
*Attorney, Agent, or Firm*—Staas & Halsey

[57]  ABSTRACT

A high-energy radiation-sensitive pattern-forming resist material consisting of polysilsesquioxane having no hydroxyl group in its molecule. The pattern-forming material of this invention has an improved sensitivity to high-energy radiation exposure, a high resistance to dry etching, a high resolution capability, and an improved thermal stability.

10 Claims, 22 Drawing Figures

USE OF POLYSILSESQUIOXANE WITHOUT HYDROXYL GROUP FOR FORMING MASK

This is a divisional of co-pending application Ser. No. 739,158 filed on May 30, 1985.

BACKGROUND OF THE INVENTION

The present invention relates to lithography, more particularly, to a pattern-forming resist or resist material suitable for forming a high quality resist pattern on a substrate or base material, usually a semiconductor, in the production of semiconductor integrated circuits and other semiconductor devices, for example, large-scale integrated circuits and bubble memory devices. The pattern-forming material is sensitive to high-energy radiation such as electron beams, X-rays, soft X-rays, and ion beams and is thermally stable.

A plurality of pattern-forming resist materials are available for the purpose of recording the high-energy radiation described above. In addition to single resist layers, further, there are multi-layered resist coatings such as duplitized or two-layered resist coatings or three-layered resist coatings. A multi-layered resist coating is useful in the formation of fine patterns on an uneven substrate using, for example, submicron electron beam lithography. This is because, as described hereinafter, the multi-layered resist coating effectively decreases scattering of the electron beam and its adverse influence on patterning, and/or a proximity effect. The differences in effect between a single resist layer and a duplitized resist coating in the electron beam lithographic process will be described with reference to FIGS. 1 and 2.

FIG. 1 illustrates steps of a pattern formation process using a single resist layer. A substrate 1 has a single layer 2 of the resist material applied thereon. As shown in FIG. 1(b), the resist layer 2 is irradiated with a pattern of electron beams (e−). During the patterning process, the electron beams are undesirably scattered within the resist layer 2. (Scattering of electron beams is shown by arrows a and b.) Scattering a is caused due to the properties of the resist layer 2, while scattering b is caused by back scattering of the electron beams from the substrate 1.

The illustrated scattering of the electron beams adversely affects the accuracy of the resulting resist pattern. For example, if the resist layer 2 has a relatively high thickness, the resulting resist pattern will show extension of the pattern ends. Further, if the layer 2 is relatively thin, the width of the resist pattern will be increased due to back scattering of an electron beam once striking the substrate 1. In both of these cases, it is impossible or difficult to form fine resist patterns on the underlying substrate. The insufficient and undersirable patterning of the resist layer is apparent from FIG. 1(c), a cross-sectional view of the developed resist layer 12.

FIGS. 2(a) to (c) show a typical example of the use of the duplitized resist coating. The principle of the illustrated method is also applicable to a pattern-forming process of this invention. As shown in FIG. 2(a), the substrate 1 has applied thereon a lower resist layer 3 and an upper resist layer 4 thinner than the layer 3. The thicker layer 3 is sandwiched between the substrate 1 and the thinner layer 4 and is formed from an organic resin having no sensitivity to the energy radiation used during the patterning of the layer 4. The layer 3 is further effective to level an uneven surface of the underlying substrate, for example, the surface of LSI chips, and therefore is generally referred to as a leveling layer.

Upon electron beam exposure, the exposed area of the upper resist layer 4 is insolubilized due to cross-linking of the resist material (see reference number 14 of FIG. 2(b)). Development is then carried out to remove the unexposed area of the resist layer 4. The patterned resist layer 14 is obtained. The pattern of the layer 14 is transferred to the underlying layer 3 by dry etching the layer 3 through the patterned layer 14, which acts as a mask or masking element. The patterned resist layer is shown in FIG. 2(c).

As is apparent from the above description and the accompanying drawings, the duplitized resist coating (3 plus 4) is free from scattering of the electron beams, since the upper layer 4 is very thin and the lower layer 3 is not affected by the electron beams during patterning of the upper layer 4. This effectively diminishes lateral extension of the pattern width. The effect is greater along with lesser layer thicknesses of the layer 4. Further, increase of the layer thickness of the lower layer 3 diminishes the influence of back scattering of electron beams onto the patterning, thereby resulting in a decreased proximity effect. As a result, fine resist patterns with a high accuracy and a high aspect ratio can be obtained. The term "aspect ratio" used herein, as is generally recognized in the art, means the ratio of the layer thickness to the pattern width of the resist pattern. A high aspect ratio means that the resist pattern has a high accuracy of size.

However, no satisfactory resist material for the formation of the upper layer of the duplitized resist coating has yet been proposed. A prior art upper-layer forming resist material is chloromethylated polydiphenylsiloxane of the structural formula:

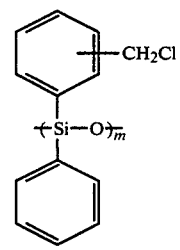

which is referred to as SNR in this field. The resist material has a high resistance to oxygen plasma etching used in the etching of the underlying resist layer and shows an electron beam sensitivity of about 5 $\mu C/cm^2$ and a submicron resolution capability. Reference should be made to EP No. 122,398-A and M. Morita et al: "Silicone-type negative-working resist SNR (I)", 44th Symposium Preprint, 28a-T-1, Japan Society of Applied Physics, P. 243, Sept. 1983. Another prior art upper layer-forming resist material is P(SiSt-CMS) reported in N. Suzuki et al: "Resist material for duplitized structure", 44th Symposium Preprint, 26a-U-7, Japan Society of Applied Physics, P. 258, Sept. 1983. P(SiSt-CMS), namely, the copolymer of trimethylsilylstyrene and chloromethyl styrene of the structural formula:

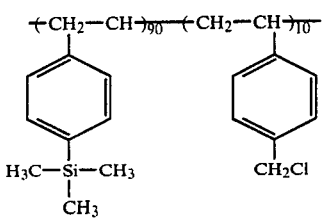

is resistant to oxygen plasma and has an electron beam sensitivity of about 4 $\mu C/cm^2$ and a submicron resolution capability. Both of these resist materials, However, cause corrosion of the underlying aluminum or other metal circuit because they contain chlorine atoms.

Another resist material suitable for the formation of the upper layer of the duplitized resist coating is reported in M. Hatzakis, J. Paraszczak and J. Shaw, in "Proceedings of the International Conference on Microlithography (Microcircuit Engineering '81, Lausanne)", P. 386 (1981). PDMS reported therein, namely, dimethylsiloxane of the structural formula:

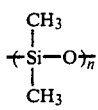

is resistant to oxygen plasma and has an electron beam sensitivity of about 2 $\mu C/cm^2$ and a resolution capability of about 0.5 $\mu m$ l/s. There is no problem about the corrosion of metal wiring or the circuit because PDMS does not contain a chlorine atom in its molecule. However, PDMS is generally oily or gummy at an ordinary temperature, it is difficult to obtain a uniform and thin coating of the resist.

The research staff of Fujitsu Limited found that silicone resins having a ladder structure, particularly polysilsesquioxane, is highly sensitive to high-energy radiation such as electron beams or X-rays and is highly resistant to reactive ion etching, plasma etching, sputter etching, or other dry etching and therefore is useful as a pattern-forming resist material (Japanese Unexamined Patent Publication (Kokai) No. 56-49540). The resist material can be effectively used in the formation of the upper resist layer discussed above, but there are several difficulties when it is used in such a lithography process. First, the described resist material easily hardens when its coating is heated to evaporate the solvent therefrom. The hardened resist coating is insoluble in the developing solution and therefore cannot be used in the subsequent patterning steps. Heating of the coated resist material at a relatively low temperature is not desirable since it means a longer processing time. Second, the described resist material is thermally instable and, therefore, cannot be stored for a long period without change of its properties. Third, it is impossible to prepare a monodispersed sample of the resist material which shows a high resolution capability. This is because the dependence of the solubility of the resist material or polysilsesquioxane on its hydroxyl equivalent and molecular weight makes the fractional precipitation process necessary for such preparation difficult.

Therefore, what is now desired is a high-energy radiation-sensitive pattern-forming resist material having improved sensitivity to electron beams, X-rays, proton beams and other high-energy radiation exposure, resistance to reactive ion etching, sputter etching, plasma etching, and other dry etching, improved resolution capability based on monodispersibility of the material or polymer, and thermal stability. The material should not cause corrosion of the underlying aluminum or other metal circuit if it is used in the production of semiconductor devices. Further, the material should be capable of being uniformly and thinly coated and should be effectively usable in the formation of a single resist layer as well as an upper layer of the duplitized resist coating. Use of the resist material in the formation of the three-layered resist coating is not contemplated, since the coating comprises a substrate having coated thereon a leveling layer, a plasma etching-resistant layer, and a resist layer and therefore it necessitates lots of complicated and troublesome process steps.

SUMMARY OF THE INVENTION

It was found that a pattern-forming resist material which consists of polysilsesquioxane having no hydroxyl group in its molecule has an improved sensitivity to high-energy radiation of up to an order of about 1 $\mu C/cm^2$ and a high resolution capability of about 0.3 to 0.5 $\mu m$ l/s. The resist material is stable at a high temperature. It does not harden for about one hour at a temperature of less than 300° C., for example. Since the resist coating is not hardened during prebaking at about 100° C. to 120° C., wherein the solvent is evaporated and adhesion to the underlying layer to be processed improved, the molecular weight of polysilsesquioxane and therefore the sensitivity and resolution capability of the resist coating can be maintained without deterioration. The resist material can be effectively used in the production of LSI's, very-large-small integrated–circuits (VLSI's) and other semiconductor devices.

The polysilsesquioxane of this invention suitable as the resist material, particularly as a negative-working resist material, is preferably that represented by the formula:

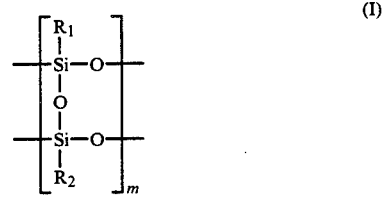

in which $R_1$ and $R_2$ may be the same or different and each represents a substituted or unsubstituted alkyl group such as methyl, chloromethyl, or ethyl, a substituted or unsubstituted aryl group such as phenyl, chlorophenyl, or tolyl, or a substituted or unsubstituted vinyl group, and m is a positive integer of about 25 to 4,000. The weight-average molecular weight (Mw) of this polymer is about 3,000 to 500,000.

More preferably, the polysilsesquioxane is silylated polysilsesquioxane of the formula:

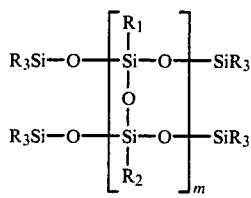

(II)

in which $R_1$, $R_2$ and m are as defined above, and $R_3$ represents a substituted or unsubstituted alkyl group or a substituted or unsubstituted aryl group. A typical example of the preferred silylated polysilsesquioxane is trimethyl-silylated polysilsesquioxane of the formula:

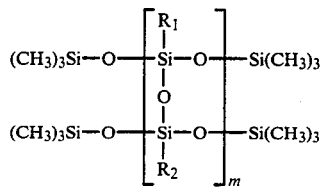

(IIA)

in which $R_1$, $R_2$ and m are as defined above.

According to this invention, there is also provided a process for the production of a high-energy radiation-sensitive pattern-forming resist material, which comprises condensing a trifunctional siloxane and removing an active hydrogen of the remaining unreacted hydroxyl groups in the molecule, particularly its end portions and/or other portions, of the resulting condensate, thereby forming polysilsesquioxane having no hydroxyl group in its molecule.

In the production of the above-described resist material, the removal of the unreacted hydroxyl groups from the condensation product can be effectively carried out by silylating the condensation product. A useful silylating agent is monohalogenated silane of the formula:

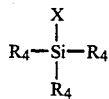

(III)

wherein $R_4$ may be the same or different and each represents hydrogen, a substituted or unsubstituted alkyl group or a substituted or unsubstituted aryl group, and X is a halogen such as chlorine. Typical examples of the preferred silylating agents are $(CH_3)_3SiCl$, $(ClCH_2)(CH_3)_2SiCl$, $(BrCH_2)(CH_3)_2SiCl$, $(C_6H_5)(CH_3)_2SiCl$, $[(CH_3)_2Si]_2O$ and $NC(CH_2)_3(CH_3)_2SiCl$. The silylating process can be preferably carried out by using trimethylchlorosilane. The active hydrogen in the remaining hydroxyl group is reacted with the chlorine in the silane compound to form hydrogen chloride, which is then removed from the reaction system.

According to this invention, there is also provided a process for the formation of a resist pattern on the underlying substrate, generally of a semiconductor, or layer to be processed, which comprises the steps of: coating on the substrate or layer a solution of the resist material which consists of polysilsesquioxane having no hydroxyl group in its molecule; drying the coated resist material in an inert gas; exposing the dried coating of the resist material to a desired pattern of high-energy radiation for patterning; and developing the patterned coating of the resist material.

The resist material used in the pattern formation process of this invention is preferably polysilsesquioxane represented by the formula (I) above, and more preferably the silylated polysilsesquioxane of the formula (II) or (IIA) above.

In a preferred embodiment of this invention, the pattern formation process may further comprise dry etching the underlying substrate or layer through a mask, namely, a pattern-wise developed coating of the resist material. The dry etching may be carried out by conventional means, such as plasma etching, reactive ion etching, or sputter etching.

According to this invention, there is provided another pattern formation process which comprises the steps of: coating on the substrate or layer a solution of a lower layer-forming first resist material which consists of an organic resin; drying the coated first resist material in an inert gas; further coating on the dried coating of the first resist material a solution of the upper layer-forming second resist material which consists of polysilsesquioxane having no hydroxyl group in its molecule; drying the overcoated second resist material in an inert gas; exposing the dried coating of the second resist material to a desired pattern of high-energy radiation for patterning; developing the patterned coating of the second resist material; dry etching the underlying coating of the first resist material through a pattern-wise developed coating of the second resist material which acts as a mask, thereby transferring a pattern of the second resist coating to the underlying first resist coating.

In this pattern formation process, the organic resin suitable for the formation of the lower or first resist layer is preferably phenol resin, polyimide resin, or polystyrene resin. Epoxy resin, novolak resin, or related organic resins are also useful. Novolak resin or photoresist is commercially available, for example, from Shipley Co. under the tradename: Microposit 1350. The organic resin, however, is not limited to those resins, so long as it has no sensitivity to radiation used in the patterning of the upper resist layer, is not removed during development of the exposed upper resist layer, and has a high resistance to dry etching used to selectively etch the underlying substrate or layer. Of course, the organic resin should have no resistance to oxygen plasma etching, when such etching is used to transfer a pattern of the upper resist layer to the lower resist layer of the organic resin.

Further, the resist material suitable for the formation of the upper or second resist layer is preferably polysilsesquioxane of the above formula (I), more preferably, silylated polysilsesquioxane of the above formula (II) or (IIA).

In the practice of the pattern formation process using the duplitized resist coating, the upper resist layer should be thinner while the lower resist layer should be thicker. The use of a thin upper layer is effective for obtaining a fine resist pattern having a high sensitivity and resolution capability. In addition to this, as a result of accurate transfer of the pattern of the upper layer to the dry etching-resistant, thick lower layer, a satisfactorily high resistance to dry etching is also obtained. Further, since the lower resist layer is thick, it is possible to level the uneven features appearing on the surface of the substrate or layer to be selectively etched. The thickness of the upper resist layer is preferably about 0.2 to 0.5 μm and that of the lower resist layer preferably about 1.5 to 3.0 μm.

Further, as in the above-described pattern formation process using a single-coated resist layer, the pattern formation process may further comprise dry etching the underlying substrate or layer through a pattern-wise etched coating of the first resist material which acts as a mask. The coating of the second resist material remaining on the first resist coating is generally removed during the dry etching step.

Further, according to this invention, there is also provided a process for the production of semiconductor devices using a lithography technique, which comprises dry etching the material to be etched through a mask formed from a high-energy radiation-sensitive pattern-forming resist material consisting of polysilsesquioxane having no hydroxyl group in its molecule, as discussed above.

DESCRIPTION OF THE PREFERRED EMBODIMENTS

Figure 1A:
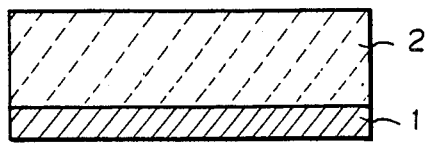
FIGS. 1(a), 1(b), and 1(c) are cross-sectional views showing, in sequence, the prior art pattern formation process using a single resist layer.
Figure 1B:
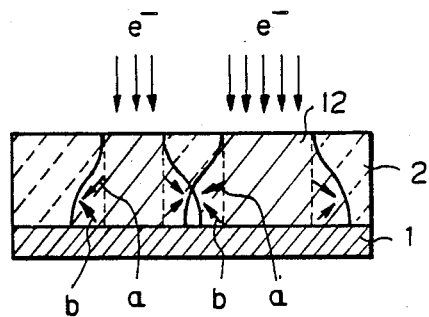
Figure 1C:
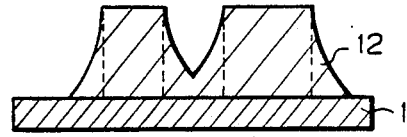
Figure 2A:
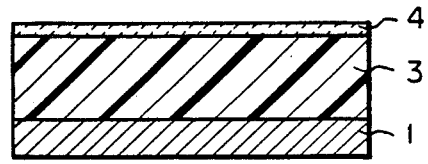
FIGS. 2(a), 2(b), and 2(c) are cross-sectional views showing in sequence, the prior art pattern formation process using a duplitized resist coating.
Figure 2B:
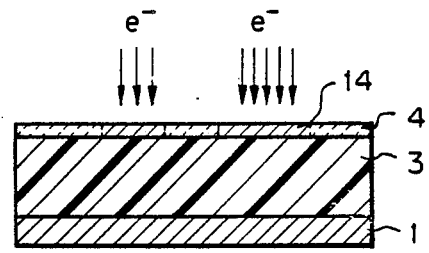
Figure 2C:
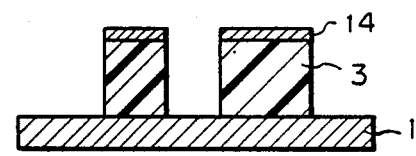

As previously described, we found that the objects of this invention are attained by treating any unreacted hydroxyl group remaining in the molecule of the condensation product of trifunctional siloxane to substitute its active hydrogen with a suitable substitutent, such as a silyl group.

Generally, polysilsesquioxane can be easily produced by condensing trifunctional siloxane. For example, polymethylsilsesquioxane can be produced by the following reaction schema:

Hydrolysis

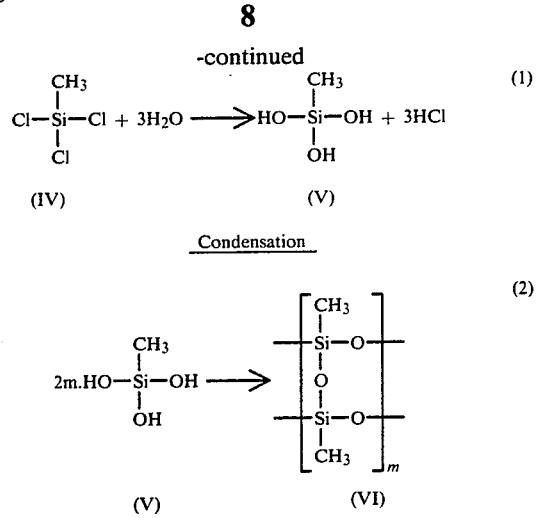

Condensation

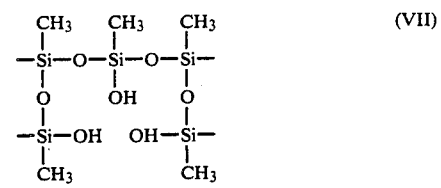

Namely, methyltrichlorosilane (IV) is first subjected to hydrolysis, and then the resulting hydrolyzate (V) is condensed to form polymethylsilsesquioxane (VI). However, the finally resulting condensation product is not polymethylsilsesquioxane of the above formula (VI), but, in fact, polymethylsilsesquioxane having the following portion, for example:

$$\begin{array}{ccc} CH_3 & CH_3 & CH_3 \\ | & | & | \\ -Si-O-Si-O-Si- \\ | & | & | \\ O & OH & O \\ | & & | \\ -Si-OH & OH-Si- \\ | & & | \\ CH_3 & & CH_3 \end{array} \quad (VII)$$

from which it is apparent that there are unreacted hydroxyl groups in the molecule of the condensation product.

Our study of polymethylsilsesquioxane (VII) revealed the fact that unreacted hydroxyl groups contained in the molecule of ladder-type silicone resin or polysilsesquioxane can adversely affect the characteristics of polysilsesquioxane in the resist process, thereby resulting in drawbacks discussed in the description of the related prior art. Based on the above, we found that polysilsesquioxane having no hydroxyl group in its molecule, particularly silylated polysilsesquioxane, is useful as a pattern-forming resist material.

Further, we studied the production of the described polysilsesquioxane and its use as the resist for high energy radiation exposure, with reference to PMSS. The results are described in the following examples.

Example 1

This example is included to explain the production of PMSS according to the reaction schema (1) and (2) described above.

A reactor containing 540 ml of methyl isobutyl ketone (MIBK) as a solvent and 84 ml of triethylamine (TEA) was bubbled and saturated with nitrogen gas. The solution was then cooled, and 78 ml of methyl trichlorosilane (MTCS) was added to the solution. While maintaining the lower temperature of the solution, about 100 ml of ion-exchanged water was added dropwise to cause the hydrolysis reaction (1) of methyltrichlorosilane. After completion of the addition of water, the solution was gradually heated and the warm solution was maintained for about 90 minutes. Thereafter, the solution was further heated to cause the condensation reaction (2). Infrared (IR) spectrophotometric analysis of the resulting condensation product indicated that the product has the structure of formula (VII) described above. Further, gel permeation chromatography (GPC) using a column of polystyrene gel showed that the product (VII) has a molecular weight of about 20,000. The product, however, hardened after heating at about 80° C. for 10 minutes, because of the presence of the unreacted hydroxyl groups.

Ten g of the above-prepared product (VII) was dissolved in 100 ml of toluene to start the silylation. To the solution, 20 ml of pyridine was added, and 10 g of trimethyl-chlorosilane (TMCS) was dropped. The reaction was maintained at a temperature of 60° C. for 2 hours. After the reaction, the reaction product was repeatedly washed each time with 50 ml of water to completely remove the pyridine salt. After washing with the water, acetonitrile was added to the product until no further precipitate was formed. The final product was the desired PMSS having a molecular weight of 20,000 and a degree of dispersion of 1.5. PMSS did not harden after heating at 200° C. for 1 hour.

In this example, it is believed that the silylation process proceeded according to the following reaction schema:

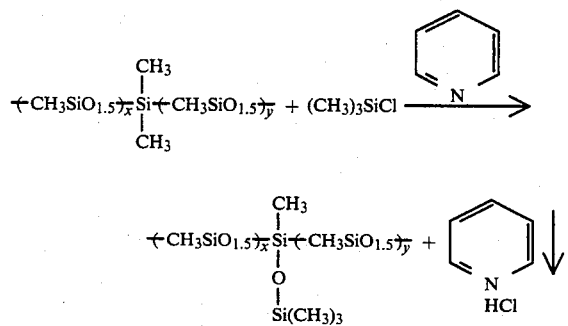

EXAMPLE 2

The silylation procedure of Example 1 described above was repeated except that the reaction product (VII) was replaced with low molecular weight ($\overline{M}w=4,000$) polymethylsilsesquioxane having unreacted hydroxyl groups in its end portions. The polymethylsilsesquioxane used in this example started to harden after heating at 60° C. for 10 minutes.

The resulting PMSS had a molecular weight of 4,000 and a degree of dispersion of 1.2. PMSS did not harden after heating at 105° C. for 1 hour.

In this example, it is believed that the silylation process proceeded according to the following reaction schema:

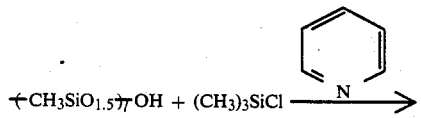

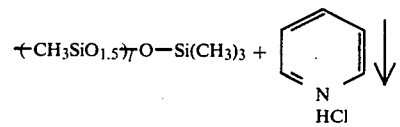

Further, as a result of study of the production of PMSS, it was determined that: (1) Mixing of methyltrichlorosilane (MTCS) with water at an ordinary temperature results in gelation of the reaction product due to the rapid reaction. The gelation of the product, however, can be effectively inhibited if the starting materials are mixed at a lower temperature and under controlled reaction conditions. (2) The sensitivity of PMSS is generally increased with an increase of its molecular weight. High polymerization of PMSS can be attained if the condensation is carried out under pressure. (3) Reproducible production of PMSS can be attained if the fractional precipitation process is carried out using, for example, isopropyl alcohol (IPA) as a good solvent or non-polar solvent and methanol as a bad solvent or polar solvent. (4) Preparation of monodispersed PMSS is effective to increase the resolution capability of the pattern-forming material. Such preparation is carried out by using a fractional precipitation process, which generally depends on two factors, namely, the hydroxyl equivalent and molecular weight of the polysilsesquioxane to be monodispersed. According to this invention, monodispersed PMSS having a degree of dispersion of less than 2.0 can be easily prepared, thereby resulting in fine resist patterns having a resolution capability of less than 0.5 μm l/s. This is because PMSS of this invention has no hydroxyl group and therefore the fractional precipitation process used in the preparation of monodispersed PMSS can be carried out just based on the differences of the molecular weight. In contrast, the prior art polysilsesquioxane having hydroxyl groups is not suitable for the formation of monodispersed PMS.

EXAMPLE 3

Figure 3A:
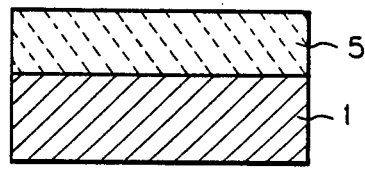
FIGS. 3(a), 3(b), and 3(c) are cross-sectional views showing, in sequence, the pattern formation process of this invention using a single resist layer.
Figure 3B:
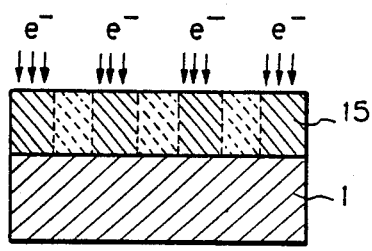
Figure 3C:
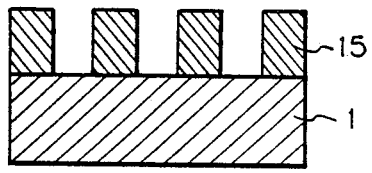

This example is included to explain the use of PMSS of this invention as a single electron beam resist, referring to FIGS. 3(a), 3(b), and 3(c).

PMSS (Molecular weight: 20,000; Degree of dispersion: 1.5) produced in Example 1 was dissolved in toluene. The toluene solution of PMSS, as is shown in FIG. 3(a), was spin-coated on a silicon wafer or substrate 1 at a layer thickness of 0.5 μm. The PMSS resist layer 5 was then dried at 80° C. for 15 minutes in a gas stream of nitrogen. After drying, the silicon wafer was conveyed into an electron beam exposure device (not shown) and was exposed to a pattern of electron beams at an accelation voltage of 20 kV. The irradiation of electron beams is shown with the reference symbol e− in FIG. 3(b). The irradiated area 15 of the resist layer was cross-linked and therefore insolubilized to a developer used in the subsequent development step. The silicon wafer was then dipped in a solution of methyl isobutyl ketone (MIBK) for one minute to develop the irradiated area 15 of the resist layer. A fine resist pattern 15 having a resolution capability of 0.5 μm l/s was obtained (see FIG. 3(c)). The sensitivity was $7.0 \times 10^{-6}$ C/cm².

EXAMPLE 4

The procedure of Example 3 was repeated, except that PMSS of Example 1 was replaced with PMSS (Molecular weight: 4,000; Degree of dispersion: 1.2) produced in Example 2 described above. A fine resist pattern having a resolution capability of 0.3 μm l/s was obtained. The sensitivity was $4.0 \times 10^{-5}$ C/cm$^2$.

EXAMPLE 5

This example is included to explain the experiments which were made to ascertain applicability of PMSS, as an electron beam resist, to the single-coat resist process and to evaluate the sensitivity and resolution capability of PMSS.

Four samples of PMSS described in the following Table 1 were prepared in this example. Fractionation of these PMSS samples was made using 4-methyl-2-pentanone as a good solvent and acetonitrile as a bad solvent. The distribution of the molecular weight of the fractionated PMSS was determined by GPC using a column of polystyrene gel and a mobile phase of tetrahydrofuran (THF) and at a flow rate of 1.5 ml/min.

TABLE 1

| Sample | $\overline{M}w$ | $\overline{M}n$ | $\overline{M}w/\overline{M}n$[1] |
|---|---|---|---|
| PMSS-1 | $1 \times 10^4$ | $9 \times 10^3$ | 1.1 |
| PMSS-2 | $3 \times 10^4$ | $26 \times 10^3$ | 1.2 |
| PMSS-3 | $14 \times 10^4$ | $28 \times 10^3$ | 5.0 |
| PMSS-4 | $40 \times 10^4$ | $93 \times 10^3$ | 4.3 |

[1]$\overline{M}w/\overline{M}n$: Degree of dispersion

Each sample of PMSS described above was dissolved in 4-methyl-2-pentanone. The PMSS resist solution was spin-coated on a silicon substrate and then prebaked at 80° C. for 20 minutes in a stream of nitrogen gas. The dried resist layer had a thickness of 1.0 μm. The resulting resist samples were tested to ascertain the relation between the molecular weight of PMSS and its sensitivity or resolution capability and the relation between a developing solution or rinsing solution used and a resolution capability of the resist pattern. The results are described hereinafter.

Figure 5:
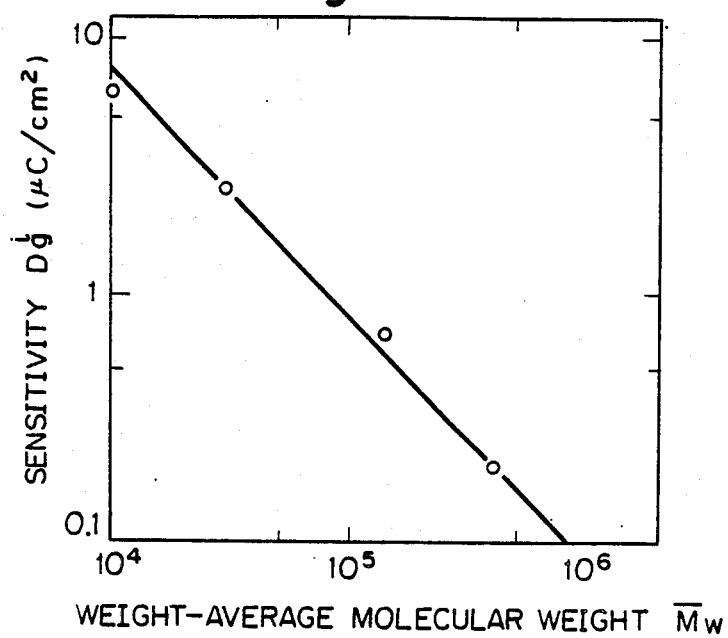
FIG. 5 is a graph of a relation between the molecular weight of silylated polymethylsilsesquioxane (PMSS) and its electron beam (EB) sensitivity.

FIG. 5 shows the relation between the weight-average molecular weight ($\overline{M}w$) of PMSS and its sensitivity ($D_g{}^i$). The graph of this figure indicates that PMSS ($\overline{M}w=3\times10^4$) has an EB sensitivity of 1.6 μC/cm$^2$, while high-molecular weight PMSS ($\overline{M}w=4\times10^5$) has a high EB sensitivity of 0.2 μC/cm$^2$. This means that the sensitivity of PMSS varies depending upon its molecular weight.

Further, it is theoretically demonstrated that the relation between sensitivity and molecular weight satisfies the formula: $(\overline{M}w) \times (G_g{}^i) = $ const. Since the product ($\overline{M}w$) and $D_g{}^i$ is the reactivity of PMSS to an electron beam, it can be said that the smaller the product of ($\overline{M}w$) and ($D_g{}^i$), the higher the sensitivity of PMSS. Table 2 shows $(\overline{M}w) \times (D_g{}^i)$ values of typical negative-working EB resists.

TABLE 2

| Type of resist | $\overline{M}w \times D_g{}^i$ (C/cm$^2$) |
|---|---|
| Present invention | |
| PMSS-4 | 0.08 |
| For duplitized resist coating | |
| SNR[1] | 0.11 |
| P(SiSt—CMS)[1] | 0.32 |
| For single resist layer | |
| CMS[2] | 0.13 |
| PGMA[3] | 0.028 |

[1]Previously cited
[2]Chloromethylated polystyrene
[3]Polyglycidyl methacrylate Table indicates that PMSS-4 of this invention has a low $(\overline{M}) \times (D_g{}^i)$ value. The value is next lowest after that of PGMA, which is a prior art resist having a remarkably high sensitivity and the lowest among three silicone resists described in the table. The reason why PMSS having no functional group shows a remarkably high sensitivity is considered to be that it contains silicon atoms whose molecular weight is higher than that of the carbon atom, and the ratio of the silicon atoms contained in PMSS is higher than that of the other resist materials, and therefore shows notable internal scattering of electrons in the resist layer.

Figure 6:
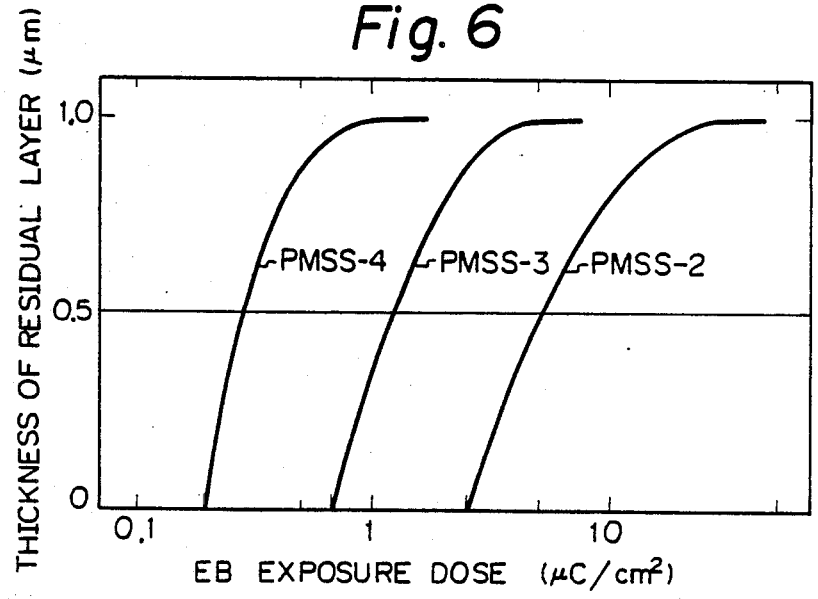
FIG. 6 is a graph of the sensitivity characteristics of PMSS having different molecular weights.

In addition, FIG. 6 shows a sensitivity curve of each of PMSS-2, PMSS-3, and PMSS-4. From these graphs, it is clear that the higher the molecular weight of PMSS, the higher the sensitivity.

As is apparent from the above discussion, PMSS of this invention exhibits a molecular weight and sensitivity or resolution capability of a relation similar to that of the prior art negative-working resist. When the molecular weight of PMSS is increased, the sensitivity is increased, but the resolution capability is decreased. Namely, the sensitivity and the resolution capability are in an inverse relation. However, when the resolution capability of PMSS is compared with that of the prior art resist, its decrease with the increase of the molecular weight is less than that of the prior art, since PMSS is a rigid high polymer having a ladder structure and no or little interlock of the molecular chains and therefore is rapidly soluble in a solvent.

Based on the above results of experiments, it was attempted to further increase the resolution capability of PMSS-4 ($\overline{M}w=4\times10^5$) through the optimization of the developing and rinsing solutions used in the subsequent steps.

Figure 7:
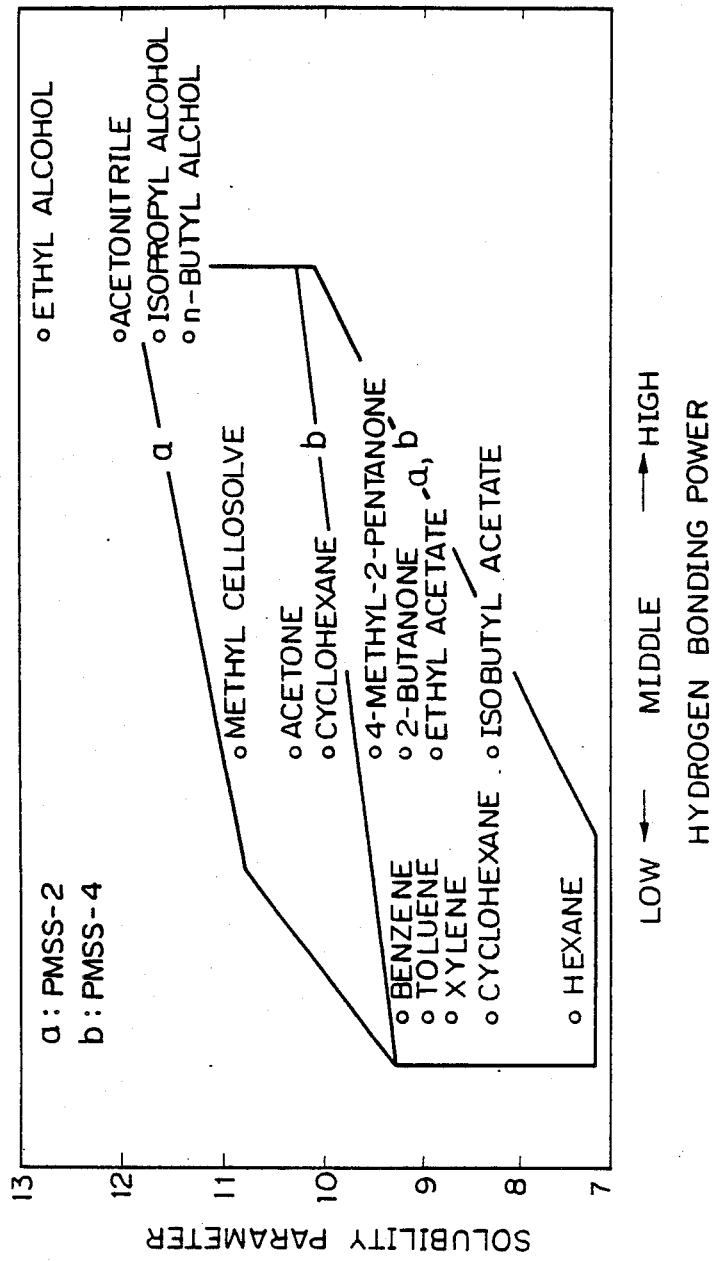
FIG. 7 is a graph of the range of good solvents for PMSS of this invention.

FIG. 7 is a graph of the range of good solvents for PMSS-2 and PMSS-4 of this invention. The graph indicates that the solubility of PMSS in a solvent varies remarkably depending upon its molecular weight. PMSS, if its molecular weight is increased, becomes hardly soluble in ketone-type solvents. In fact, PMSS-4 ($\overline{M}w=4\times10^5$) is insoluble in acetone and cyclohexane. Generally, the polymeric compounds, when their molecular weight is increased, tend to show a decreased solubility due to limitation of their movement in the solution. PMSS of this invention has this tendency, too. The tendency of PMSS is remarkably greater than that of the polymeric compounds described above. It is believed that the solubility of PMSS is excessively decreased with an increase of its molecular weight, because the limitation on the movement of the PMSS molecule is larger than that of the prior art straight-chain polymeric compounds due to the rigid, ladder-type main chains of PMSS.

In the formation of resist patterns, the exposed resist coating was developed with a developing solution of (a) hexane, (b) xylene, or (c) 4-methyl-2-pentanone and then rinsed it with isopropyl alcohol (IPA). In case (a), using hexane as the developer, the resulting resist pattern of PMSS-4 swelled due to the high solubility of PMSS-4 in hexane and a plurality of resist bridges were formed. For cases (b) and (c), using xylene and 4-methyl-2-pentanone, respectively, the formation of resist bridges could be inhibited, but much developing residues were produced. Comparing case (b) with case (c), the use of 4-methyl-2-pentanone is more suitable for the formation of a rectangular resist pattern than the use of xylene.

From the above results, it is clear that, among the three developing solutions described above, 4-methyl-2-pentanone is the most suitable developer for the formation of satisfactory resist patterns.

Further, in order to ascertain the relation between a rinsing solution and a configuration or profile of the resulting resist pattern, the following experiments were conducted

| Experiment No. | Developing solution | Rinsing solution |
| --- | --- | --- |
| 1 | 4-methyl-2-pentanone | — |
| 2 | " | Acetone |
| 3 | " | Mixture of acetone and IPA (vol. ratio 1:1) |
| 4 | " | IPA |

The results of Experiment No. 1 without rinsing showed that the resist pattern swelled and did not resolve even a space of 3 $\mu$m. In contrast, Experiment Nos. 2, 3, and 4 with rinsing showed the increase of the resolution capability of the PMSS resist. As a result of the experiments, the mixture of acetone and IPA (volume ratio of 1:1) was found to be useful to control the rinsing effects and to obtain satisfactory resist patterns.

EXAMPLE 6

This example is included to explain the use of PMSS of this invention as an upper resist layer of the duplitized resist coating in the formation of a mask of tantalum for X-ray exposure. PMSS of this invention, as previously explained, is a high sensitivity resist material. FIGS. 4(a) through 4(f) are referred to.

Figure 4A:
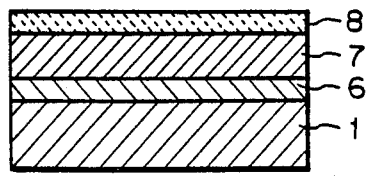
FIGS. 4(a) through 4(f) are cross-sectional views showing, in sequence, the pattern formation process of this invention using a duplitized resist coating.

A 0.8 $\mu$m thick tantalum (Ta) coating 6 was deposited on a silicon wafer or substrate 1 through a sputtering technique. Then, in order to form a lower resist layer of the duplitized resist coating, the photoresist Microposit 1350, commercially available from Shipley Co., was spin-coated on the tantalum coating 6 and baked at 200° C. for one hour in a gas stream of nitrogen. The layer thickness of the lower photoresist layer 7 was 0.9 $\mu$m. After the baking, a solution of PMSS ($\overline{M}w=25,000$) of this invention in 4-methyl-2-pentanone was spin-coated on the photoresist layer 7 and prebaked at 80° C. for 20 minutes in a gas stream of nitrogen. The resulting upper PMSS layer 8 had a layer thickness of 0.1 $\mu$m. The layer structure of the wafer is shown in FIG. 4(a).

Figure 4B:
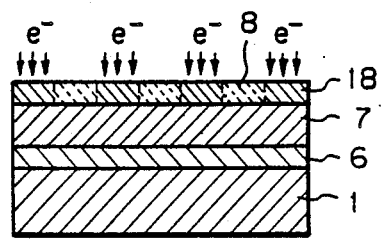

In the patterning step illustrated in FIG. 4(b), the silicon wafer was pattern-wise irradiated with an electron beam e− at an accelerating voltage of 20 KV. Upon the electron beam exposure, the irradiated area 18 of the upper PMSS layer was insolubilized.

Figure 4C:
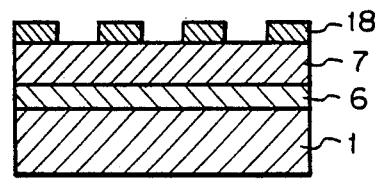

Thereafter, the silicon wafer was developed by dipping it in methyl isobutyl ketone (MIBK) for 30 seconds. The nonirradiated area of the upper PMSS layer was therefore removed. Subsequent to the development, the silicon wafer was rinsed in isopropyl alcohol (IPA) for 30 seconds and then postbaked at 80° C. for 15 minutes in a gas stream of nitrogen. The result is illustrated in FIG. 4(c).

Figure 4D:
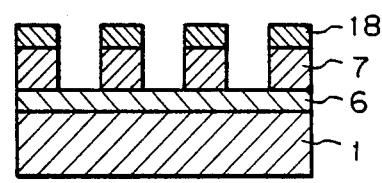

Thereafter, for the pattern transfer purpose, the silicon wafer was conveyed into a dry etching device of a parallel plate-shaped electrode type and dry etched with oxygen plasma (Gas pressure: 2 Pa; Applied power density: 0.22 W/cm$^2$) for 5 minutes. As illustrated in FIG. 4(d), the pattern of the upper PMSS layer 18 was transferred to the underlying photoresist layer 7. The upper PMSS layer 18 acted as an intermediate mask in the dry etching step.

Figure 4E:
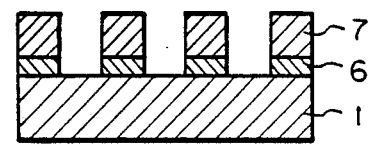

After completion of the oxygen plasma etching, as illustrated in FIG. 4(e), the tantalum coating 6 was etched with the plasma of the mixed gas (C Cl$_4$ plus CF$_4$/2:1) using a mask of the lower photoresist layer 7. The gas pressure was 8 Pa, the applied power density was 0.33 W/cm$^2$, and the etching time was 4 minutes. The upper PMSS layer 18 was removed during the dry etching step.

Figure 4F:

Finally, the remaining mask 7 of the photoresist was removed using a conventional removal technique. As is shown in FIG. 4(f), the silicon wafer having the patterned tantalum coating 6 was obtained. A resolution capability of the tantalum patterns was 0.25 $\mu$m l/S. The sensitivity was 10 $\mu$C/cm$^2$.

The resulting patterns of tantalum on the silicon wafer is unexpectedly effective as a mask for X-ray exposure, since the X-rays are not permeated to the tantalum patterns.

In contrast, hereinbefore, it was difficult to produce an X-ray mask consisting of tantalum patterns of submicron resolution, if the tantalum mask was produced using a electron beam exposure method and a single resist layer. This is because tantalum (atomic number 73, and atomic weight 181) shows a large electron scattering characteristic or power, and therefore results in unacceptably large backscattering of the electron beam within the single resist layer. Finally, the tantalum for X-ray exposure could not be produced.

EXAMPLE 7

This is a comparative example.

The procedure of Example 6 described above was repeated, except for the following changes:

(1) The photoresist CMS-EX (chloromethylated polystyrene) commercially available from Toyo Soda Mfg. Co., Ltd. was used as a resist. It was spin-coated and prebaked at 80° C. for 20 minutes in a gas stream of nitrogen to obtain a 1 $\mu$m thick resist layer.

(2) The upper resist layer of PMSS was omitted.

(3) The EB exposed resist layer was developed by dipping the silicon wafer in acetone for 60 seconds and then rinsing it in isopropyl alcohol (IPA) for 30 seconds.

The resulting resist patterns had unacceptable bridges extending over the adjacent patterns. The tantalum patterns had a resolution capability of more than 1.5 $\mu$m l/s.

EXAMPLE 8

This example is included to explain resist characteristics obtained when PMSS of this invention having a high glass transition temperature (Tg) is used as an upper layer-forming resist material in the duplitized resist process.

Novolak photoresist Microposit 1350 commercially available from Shipley Co. was coated on a silicon wafer with a spin-coater and then baked at 200° C. for one hour in a gas stream of nitrogen. A lower resist layer having a thickness of 1.5 μm was formed. Next, 0.4 g of PMSS was dissolved in 1.5 ml of toluene. The resulting upper layer-forming resist solution was spin-coated on the previously formed lower resist layer and baked at 80° C. for 10 minutes in a gas stream of nitrogen. The dry thickness of the upper resist layer was 0.5 μm.

The silicon wafer with the duplitized resist coating described above was pattern-wise exposed to an electron beam using an acceleration voltage of 20 KV. The exposure dose was controlled by varying the exposure time at a constant beam current. After the EB exposure, the upper resist layer was developed by dipping the wafer in a mixed solution of xylene and o-dichlorobenzene (3:1) at a temperature of 23° C. for 90 to 120 seconds. Thereafter, the lower resist layer was dry etched with oxygen plasma using a mask of the patterned upper resist layer. The applied power density was 0.33 W/cm$^2$, gas pressure was 8 Pa, and etching time was 10 minutes. The pattern of the upper resist layer was transferred exactly to the underlying lower resist layer.

Figure 8:
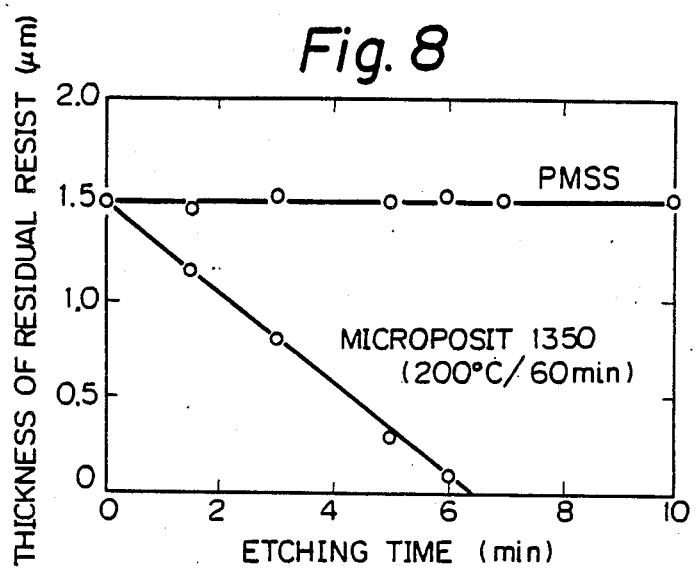
FIG. 8 is a graph of the thickness of the residual PMSS and Microposit 1350 resist as a function of the etching time.

PMSS and Microposit 1350 were tested as to the thickness of the residual layer as a function of the etching time. The results are plotted in FIG. 8. FIG. 8 indicates that a PMSS resist layer does not decline in layer thickness within the first 10 minutes of oxygen plasma etching, namely, it has a high resistance to oxygen plasma. In contrast, the Microposit 1350 resist layer (1.5 μm thickness) was gradually etched with time and was completely removed in about 6 to 7 minutes.

Further, it was learned that PMSS ($\overline{M}w=83,000$) has a higher sensitivity of 1 μC/cm$^2$ and a high resistance to oxygen plasma and that PMSS, if it is used as a upper layer of the duplitized resist coating, results in a pattern having a resolution capability of 0.9 μm l/s.

EXAMPLE 9

This example is included to further explain resist characteristics obtained when PMSS of this invention is used as an upper layer of the duplitized resist coating.

Polyvinyl phenol ($\overline{M}w=4900$) and o-cresol-novolakepoxy resin were mixed. Next, 0.5% by weight of benzimidazole was added as a hardening accelerator to a mixture having a functional group equivalent ratio of 1:1. The resulting mixture was dissolved in cyclohexane to prepare a leveling solution. The leveling solution was spin-coated on a silicon substrate and baked at 200° C. for 30 minutes in a gas stream of nitrogen. A leveling layer having a layer thickness of 2.0 μm was formed. Thereafter, a solution of PMSS resist was spin-coated on the leveling layer and baked at 80° C. for 20 minutes in a gas stream of nitrogen. A 0.2 μm thick upper resist layer was formed.

The silicon wafer with the duplitized resist coating described above was pattern-wise exposed to an electron beam using an acceleration voltage of 20 KV. The EB exposure dose was controlled by varying the exposure time at a constant beam current. After the EB exposure, the upper resist layer was developed by dipping the wafer in 4-methyl-2-pentanone for 60 seconds and then, in order to remove the developer, rinsing the wafer by dipping it in a mixed solution of acetone and isopropyl alcohol (IPA) (1:1) for 30 seconds.

After patterning of the upper resist layer was completed, the underlying lower resist or leveling layer was dry etched with oxygen plasma using a mask of the patterned upper resist layer. The etching was made to transfer a pattern of the upper resist layer to the leveling layer.

In the dry etching step, the etch rate was determined after the 2 μm thick leveling layer was etched for a predetermined period. Further, the depth of the undercut or lateral etch was determined using a scanning electron microscope (SEM), after completion of the dry etching of the leveling layer with oxygen plasma using a mask of the patterned upper resist layer.

Figure 9:
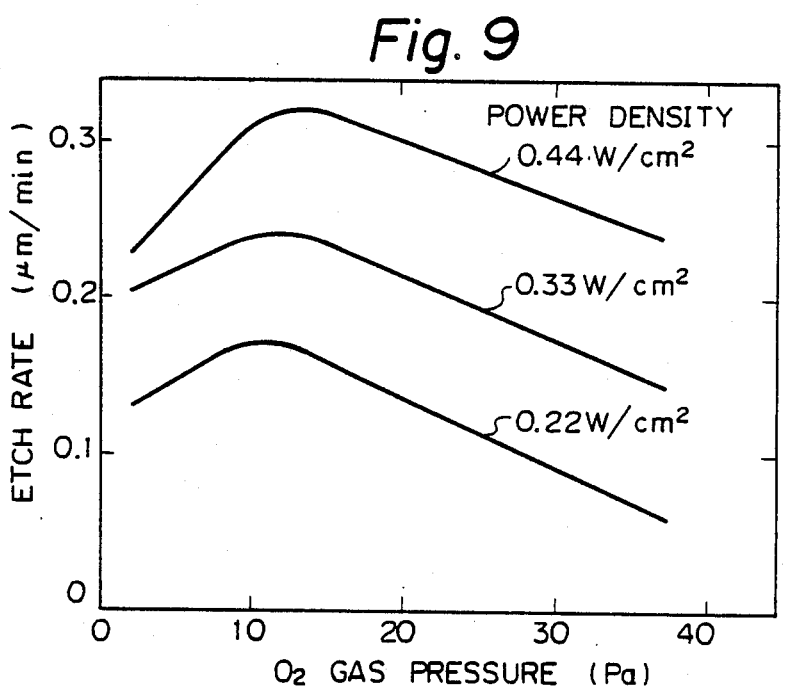
FIG. 9 is a graph of the relation between the etch rate and the etching conditions.

In order to ascertain the variation of the etch rate due to etching conditions, the leveling layer was dry etched using different oxygen gas pressures and applied power densities. The results are plotted in FIG. 9. FIG. 9 indicates that the etch rate increases with increase of the applied power density, and that a peak of the etch rate is attained when the oxygen gas pressure is from 10 to 13 Pa. It is believed that a peak of the etch rate curve is formed due to an increase or decrease of the oxygen gas pressure. When the gas pressure is higher, the energy bestowed to the individual oxygen radical is smaller, however the total number of the oxygen radicals is smaller.

Figure 10:
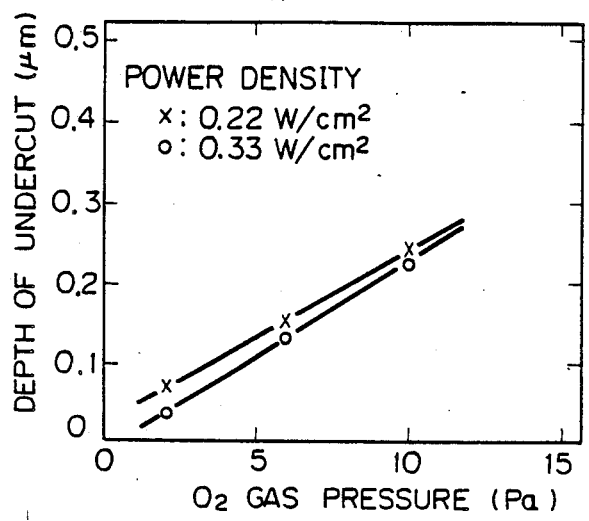
FIG. 10 is a graph of the relation between the depth of the undercut and the oxygen gas pressure.

Further, in order to ascertain the variation of the depth of the undercut or lateral etch depending upon the particular oxygen gas pressure, the leveling layer was dry etched using different oxygen gas pressures. Two power densities of 0.22 and 0.33 W/cm$^2$ were applied in the dry etching process. The results are plotted in FIG. 10. FIG. 10, showing the variation of the depth of the undercut as a function of the oxygen gas pressure, indicates that the lower the oxygen gas pressure or the higher the applied power density, the smaller the depth of the undercut. For example, when a power density of 0.22 W/cm$^2$ is applied, pattern transfer at an oxygen gas pressure of 2.0 Pa results in a small undercut of 0.07 μm. The depth of the undercut is increased with increase of the gas pressure. The depth, at a gas pressure of about 10 to 13 Pa, at which pressure the etch rate of the leveling layer shows the highest value, is about 0.25 μm. It is, therefore, considered that, when the depth of the undercut is desired to be reduced to attain a high dimensional accuracy, the etching of the leveling layer must be carried out at a reduced gas pressure and at the same time the etch rate must be lowered. Further, when the applied power density is increased to attain a higher etch rate, much resist residues are formed on the substrate. We found that if the etching of the leveling layer is carried out at an oxygen gas pressure of 2.0 Pa and applied power density of 0.22 W/cm$^2$, the transfer time of the upper resist pattern to the leveling layer is shortened to about 16 minutes and the depth of the undercut is diminished to about 0.07 μm.

Figure 11:
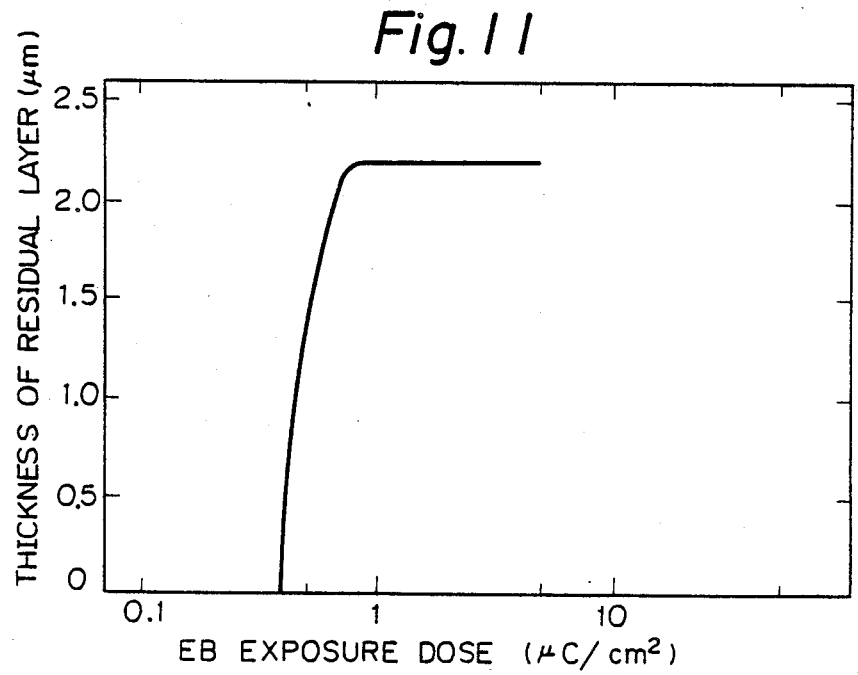
FIG. 11 is a graph of the relation between the thickness of the residual layer and the EB exposure dose.

The duplitized resist coating comprising an upper PMSS-4 layer (0.2 μm thick) and a lower leveling layer (2.0 μm thick) was prepared, and tested as to its sensitivity characteristics. The results are plotted in FIG. 11. FIG. 11 indicates that PMSS-4, when it is used as an upper layer of the duplitized resist coating, shows a remarkably improved sensitivity of 0.8 μC/cm$^2$.

The exposed upper PMSS-4 layer was developed with 4-methyl-2-pentanone and then rinsed with a mixed solution of acetone and isopropyl alcohol (IPA) (1:1). Thereafter, the lower leveling layer was dry etched with plasma oxygen at an oxygen gas pressure of 2.0 Pa and applied power density of 0.22 W/cm$^2$. For the silicon substrate, a resist pattern of 0.5/0.7 μm l/s was formed on the substrate. Further, for the aluminum substrate, a resist pattern of 2.0/0.5 μm was formed. Furthermore, these submicron patterns showed a high aspect ratio of 4.4.

EXAMPLE 10

This example is included to further explain the use of PMSS of this invention as an upper layer of the duplitized resist coating for X-ray exposure.

The procedure of Example 6 described above was repeated, but, in this example:

(1) PMSS used herein was PMSS-2 and PMSS-4.

(2) In the patterning step, the upper PMSS layer was pattern-wise irradiated with X-rays at 13 kV and 100 mA.

(3) After the X-ray exposure, the wafer was developed with methyl isobutyl ketone (MIBK) for 30 seconds, and then rinsed with isopropyl alcohol (IPA) for 30 seconds.

(4) For the pattern transfer purpose, the wafer was dry etched with oxygen plasma using a dry etching device of a parallel plate-shaped electrode type.

As a result, it was determined that the sensitivity of PMSS-2 to X-ray was 160 mJ/cm$^2$ and that of PMSS-4 was 15 mJ/cm$^2$.

Further, the above procedure was repeated using a polyimide membrane. A 0.8 μm thick tantalum pattern as a mask was formed on the polyimide membrane. After the pattern transfer to the polyimide membrane using X-ray contact exposure, PMSS-2 showed the resolution capability of 0.3 μm 1/S, and PMSS-4 showed the resolution capability 0.7 μm 1/S.

We claim:

1. A process for the formation of a resist pattern on a substrate, which comprises the steps of:

coating on the substrate a solution of a resist material for forming said resist pattern, said resist material consisting of silylated polysilsesquioxane of the formula:

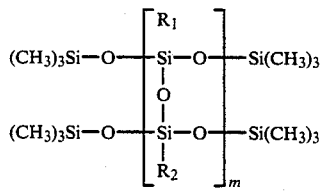

in which

R$_1$ and R$_2$ are the same or different and each represents a substituted or unsubstituted alkyl group, a substituted or unsubstituted aryl group, or a substituted or unsubstituted vinyl group, and m is a positive interger of 25 to 4,000;

drying the coated resist material in an inert gas;

exposing the dried coating of the resist material to a desired pattern of high-energy radiation for patterning; and developing the patterned coating of the resist material.

2. A pattern formation process as in claim 1, which further comprises dry etching the underlying substrate through the developed patterned coating of the resist material which acts as a mask.

3. A process for the formation of a resist pattern on a substrate, which comprises the steps of:

coating on the substrate a solution of a resist material of which said resist pattern is to be formed, said resist material consisting of silylated polysilsesquioxane of the formula:

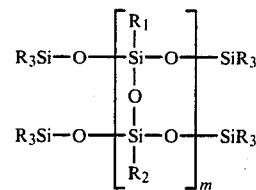

in which

R$_1$ and R$_2$ are the same or different and each represents a substituted or unsubstituted alkyl, aryl or vinyl group, R$_3$ is a substituted or unsubstituted alkyl or aryl group, and m is a positive integer in the range of 25 to 4,000;

drying the coated resist material in an inert gas;

exposing the dried coating of the resist material to a desired pattern of high-energy radiation for patterning; and developing the patterned coating of the resist material.

4. A pattern formation process as in claim 3, which further comprises dry etching the underlying substrate through the developed patterned coating of the resist material which acts as a mask.

5. A process for the formation of a resist pattern on a substrate, which comprises the steps of:

coating on the substrate a solution of a lower layer-forming first resist material which consists of an organic resin;

drying the coated first resist material in an inert gas;

further coating on the dried coating of the first resist material a solution of an upper layer-forming second resist material consisting of silylated polysilsesquioxane of the formula:

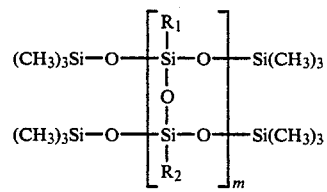

in which

R$_1$ and R$_2$ are the same or different and each represents a substituted or unsubstituted alkyl group, a substituted or unsubstituted aryl group, or a substituted or unsubstituted vinyl group, and m is a positive integer of 25 to 4,000, drying the overcoated second resist material in an inert gas;

exposing the dried coating of the second resist material to a desired pattern of high-energy radiation for patterning;

developing the patterned coating of the second resist material; and dry etching the underlying coating of the first resist material through the developed patterned coating of the second resist material which acts as a mask, thereby transferring a pattern of the second resist coating to the underlying first resist coating.

6. A pattern formation process as in claim 5, which further comprises dry etching the underlying substrate through the etched coating of the first resist material which acts as a mask.

7. A pattern formation process as in claim 5, in which the organic resin of the lower layer-forming first resist material is phenol resin, polyimide resin, or polystyrene resin.

8. A process for the formation of a resist pattern on a substrate, which comprises the steps of:
   coating on the substrate a solution of a lower layer-forming first resist material which consists of an organic resin;
   drying the coated first resist material in an inert gas;
   further coating on the dried coating of the first resist material a solution of an upper layer-forming second resist material which consists of silylated polysilsesquioxane of the formula:

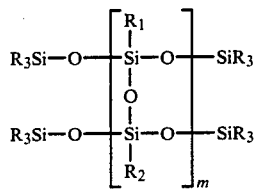

in which $R_1$ and $R_2$ are the same or different and each represents a substituted or unsubstituted alkyl, aryl or vinyl group, $R_3$ is a substituted or unsubstituted alkyl or aryl group, and m is a positive integer in the range of about 25 to 4,000;
   drying the overcoated second resist material in an inert gas;
   exposing the dried coating of the second resist material to a desired pattern of high-energy radiation for patterning;
   developing the patterned coating of the second resist material; and
   dry etching the underlying coating of the first resist material through the developed patterned coating of the second resist material which acts as a mask, thereby transferring a pattern of the second resist coating to the underlying first resist coating.

9. A pattern formation process as in claim 8, which further comprises dry etching the underlying substrate through the etched coating of the first resist material which acts as a mask.

10. A pattern formation process as in claim 8, in which the organic resin of the lower layer-forming first resist material is phenol resin, polyimide resin, or polystyrene resin.

* * * * *

UNITED STATES PATENT AND TRADEMARK OFFICE
CERTIFICATE OF CORRECTION

PATENT NO. : 4,657,843

DATED : April 14, 1987

INVENTOR(S) : Fukuyama et al.

It is certified that error appears in the above-identified patent and that said Letters Patent is hereby corrected as shown below:

Front Page, [73], "kanagawa" should be --Kawasaki-Shi--.

Col. 3, line 12, before "is resistant" insert --which--;
       line 14, "However," should be --however,--.

Col. 4, line 27, "1/s" should be --ℓ/s--1

Col. 9, in the expression vertically spanning line 35:

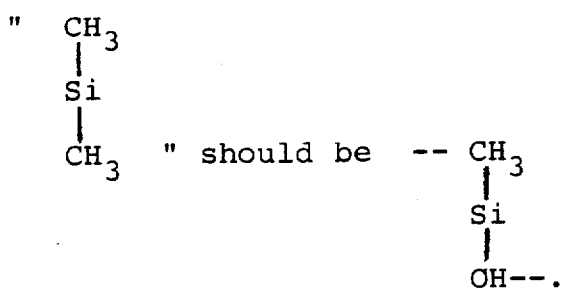

Col. 10, line 41, "PMS" should be --PMSS--;
        line 66, "1/s" should be --ℓ/s--.

Col. 11, line 6, after "produced" insert --as--;
        line 7, "1/2" should be --ℓ/s--.

Col. 12, line 9, after "Table" insert --2--;
        line 10, "(M̄)" should be --(M̄w)--;
        line 34, delete "the" (both occurrences).

UNITED STATES PATENT AND TRADEMARK OFFICE
CERTIFICATE OF CORRECTION

PATENT NO. : 4,657,843

DATED : April 14, 1987

INVENTOR(S) : Fukuyama et al.

It is certified that error appears in the above-identified patent and that said Letters Patent is hereby corrected as shown below:

Col. 14, line 24, "1/s" should be --ℓ/s--;
       line 58, "1/s" should be --ℓ/s--.

Col. 15, line 36, "1/s" should be --ℓ/s--.

Col. 16, line 67, "1/s" should be --ℓ/s--.

Signed and Sealed this

Ninth Day of February, 1988

Attest:

DONALD J. QUIGG

Attesting Officer      Commissioner of Patents and Trademarks